United States Patent
Landolt

(10) Patent No.: US 9,118,328 B2
(45) Date of Patent: Aug. 25, 2015

(54) ELECTRONIC CIRCUIT FOR OPTICAL CONTROL OF A FLIP-FLOP

(75) Inventor: Oliver Landolt, Taufkirchen (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 318 days.

(21) Appl. No.: 13/807,821

(22) PCT Filed: May 18, 2011

(86) PCT No.: PCT/EP2011/058061
§ 371 (c)(1),
(2), (4) Date: Dec. 31, 2012

(87) PCT Pub. No.: WO2012/000715
PCT Pub. Date: Jan. 5, 2012

(65) Prior Publication Data
US 2013/0105669 A1    May 2, 2013

(30) Foreign Application Priority Data

Jul. 1, 2010 (DE) .......................... 10 2010 025 782

(51) Int. Cl.
*H03K 17/78* (2006.01)
*H03K 3/2885* (2006.01)
*H03K 3/42* (2006.01)

(52) U.S. Cl.
CPC .............. *H03K 17/78* (2013.01); *H03K 3/2885* (2013.01); *H03K 3/42* (2013.01)

(58) Field of Classification Search
CPC ................................ H03K 3/42; H03K 3/2885
USPC ............. 372/43, 38.1, 38.01, 29.011, 29.012, 372/38.07; 250/214 SW
See application file for complete search history.

(56) References Cited

U.S. PATENT DOCUMENTS

| | | | |
|---|---|---|---|
| 6,445,721 B1 * | 9/2002 | Masuta et al. | 372/38.01 |
| 7,400,183 B1 | 7/2008 | Sivadasan et al. | |
| 2005/0264319 A1 | 12/2005 | Kucharski et al. | |
| 2007/0262803 A1 | 11/2007 | Hales et al. | |
| 2008/0204085 A1 | 8/2008 | Suzuki et al. | |
| 2010/0019817 A1 | 1/2010 | Cao | |

FOREIGN PATENT DOCUMENTS

| | | |
|---|---|---|
| DE | 602 05 997 T2 | 6/2006 |
| EP | 0 437 740 A1 | 7/1991 |
| EP | 0 517 037 A2 | 12/1992 |

(Continued)

OTHER PUBLICATIONS

International Preliminary Report on Patentability and Written Opinion of the International Searching Authority for International Application No. PCT/EP2001/058061, dated Jan. 8, 2013, pp. 1-7.

(Continued)

*Primary Examiner* — Tony Ko
(74) *Attorney, Agent, or Firm* — Ditthavong & Steiner, P.C.

(57) ABSTRACT

An electronic circuit contains a flip-flop, a switch, a photodiode and a mode-locked laser. The mode-locked laser generates light pulses, which generate a photocurrent in the photodiode the switch transfers the photocurrent to one of two inputs of the flip-flop. The flip-flop outputs its status to at least one output.

17 Claims, 2 Drawing Sheets

(56) References Cited

FOREIGN PATENT DOCUMENTS

| EP | 0 294 123 A1 | 3/2003 |
| WO | WO 2012/000715 A1 | 1/2012 |

OTHER PUBLICATIONS

International Search Report for International Application No. PCT/EP2011/058061, dated Aug. 22, 2011, pp. 1-6.

Jacobs et al., "Optically clocked track-and-hold for high-speed high-resolution analog-to-digital conversion", conference publication, pp. 190-192, Microwave Photonics, 2004.

Sharaf et al., "Analysis and Optimization of Series-Gated CML and ECL High Speed Bipolar Circuits", Journal, Feb. 1996, pp. 202-211, vol. 31, Issue 2, IEEE Journal of Solid-State Circuits.

\* cited by examiner

ELECTRONIC CIRCUIT FOR OPTICAL CONTROL OF A FLIP-FLOP

CROSS-REFERENCE TO RELATED APPLICATION

The present application is a national phase application of PCT Application No. PCT/EP2011/058061, filed on May 18, 2011, and claims priority to German Application No. DE 10 2010 025 782.6, filed on Jul. 1, 2010, the entire contents of which are herein incorporated by reference.

BACKGROUND OF THE INVENTION

1. Field of the Invention

The invention relates to an optically controlled flip-flop, especially a toggle flip-flop. In many time-discrete systems, a phase noise of the clock signal limits the power. With analog-digital converters, a phase noise of the clock signal leads to a noise in the sampled signal. In the case of high frequencies, this noise predominates over noise sources elsewhere in the signal path. The phase noise of the clock signal in communications systems limits the lower limit of the time interval between two successive symbols. Phase noise in a clock signal originates partly within the oscillator which generates the clock signal and partly through noise in the further circuit which distributes the clock signal.

2. Discussion of the Background

A clock signal is conventionally generated through an electronic oscillator, for example, a quartz oscillator. However, with such an oscillator, the intrinsic phase noise of the oscillator, which leads to a phase noise of the generated clock signal is disadvantageous.

Moreover, the document E. W. Jacobs, "Optically Clocked Track-and-Hold for High-Speed High-Resolution Analog-to-Digital Conversion", Proc. IEEE International Topical Meeting on Microwave Photonics, 2004, pages 190-192, shows a holding element (sample-and-hold device) comprising a diode bridge. In this context, sampling pulses are generated by means of a mode-locked laser (mode-locked laser), the output of which is supplied simultaneously to two photodiodes. In the absence of light, two current sources conduct a zero-signal current to the diode bridge. Meanwhile, the output of the diode bridge follows an analog input signal to be sampled. When a laser pulse strikes the photodiodes, the two photodiodes interrupt the zero-signal current, which is generated by the current sources, and accordingly deactivate the diode bridge. The output of the diode bridge is therefore held constant during the time duration of the laser pulse. To allow digitization by an analog-digital converter, in view of the shortness of the laser pulse, the output signal of the diode bridge must be additionally sampled by a secondary holding element in order to increase the time duration. The requirements for the phase noise of this secondary holding element are significantly reduced by comparison with the requirements for a primary holding element. An electronic generation of the clock of the secondary holding element is therefore possible. With the holding element shown in that context, it is disadvantageous that it requires two photodiodes.

SUMMARY OF THE INVENTION

The invention advantageously provides a circuit which switches at a high-precision timing point.

A given type of laser source—mode-locked laser (mode-locked laser)—generates a periodic series of very short light impulses. The time deviation of the intervals and durations of these light pulses is very small. Accordingly, there is an extremely low phase noise of the signal formed by these light pulses. In particular, this phase noise is substantially lower than is attainable by electronic oscillators. A further advantage of these laser pulses by comparison with electronic clock signals is that they can be transmitted very readily without interference, especially electromagnetic parasitics. In particular, an free-space transmission or a fiberglass transmission is possible.

Accordingly, in systems which require a low phase noise of a clock, an advantageous exploitation of the light pulses generated by mode-locked laser is possible in order to generate a clock signal. In this context, for example, a digital receiver in a serial, high-speed data-communications system is one possible application. One of the challenges of this approach is that light pulses, which are generated by the mode-locked lasers, are very short by comparison with the time between the light pulses. However, the majority of electronic circuits require a clock signal which provides an identical time duration for both clock statuses.

An electronic circuit according to the invention accordingly contains a flip-flop, a switching device, a photodiode and a mode-locked laser. The mode-locked laser generates light pulses which generate a photocurrent in the photodiode. The switching circuit transmits the photocurrent to one of two inputs of the flip-flop. The flip-flop outputs its status to at least one output. A connection of the switching device and the flip-flop with very good time precision is achieved in this manner.

The invention accordingly describes a flip-flop circuit with a photodiode. In one advantageous embodiment, the status of the flip-flop circuit changes every time a light pulse strikes the photodiode. The flip-flop can be configured here as a toggle flip-flop, of which the status is inverted with every light pulse.

BRIEF DESCRIPTION OF THE DRAWINGS

In the following section, the invention is described by way of example on the basis of the drawings, in which an advantageous exemplary embodiment of the invention is presented. The drawings are as follows.

DETAILED DESCRIPTION OF EXEMPLARY EMBODIMENTS OF THE INVENTION

Figure 1:
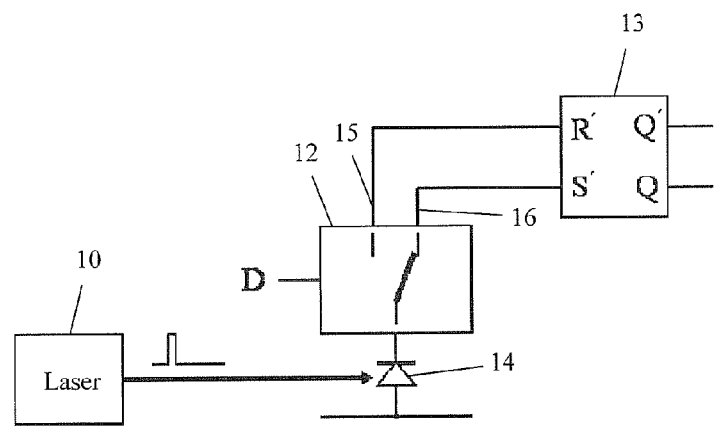
FIG. 1 shows a first exemplary embodiment of the circuit according to the invention.

The structure and functioning of various forms of the circuit according to the invention is illustrated with reference to FIGS. 1 to 4. The presentation and description of identical elements in similar drawings has not been repeated in some cases.

The mode-locked laser 10 (mode-locked laser) generates a series of extremely short laser-light pulses. In this context, a light pulse provides a very short duration, for example, 1 ps, preferably between 0.1 ps and 10 ps. The time interval between the pulses is substantially greater, for example, several 100 ps, preferably 50 ps to 10 ms. The laser light is conducted by means of free-space transmission or an optical fiber, for example, a glass fiber, to a photodiode 14. A combination of an free-space transmission and a fiber-optic transmission system is also possible. In particular, the fiber-optic system can be attached to the substrate of the photodiode 14. The photodiode 14 connects a switching element, referred to below by way of abbreviation as the switch 12, to a negative supply voltage, which can also be connected to earth. Furthermore, the switch 12 provides a data input D. The switch 12 also provides two outputs 15, 16. The two outputs 15, 16 are connected to two inputs R' and S' of a latch (latch) 13. The latter corresponds to a flip-flop. The input S' is used for setting a high status. The input R' is used for setting a low status. The latch 13 additionally provides a non-inverting output Q and an inverting output Q'.

A light pulse, which reaches the photodiode 14, generates an electrical current through the photodiode 14. The position of the switch 12 is simultaneously determined by a connected data signal at the data input D. If a low signal is connected to the data input D, the photocurrent of the photodiode 14 activates the input R' of the latch 13. The non-inverting output Q of the latch 13 is set to the status low. If a high signal is connected to the data input D, the photocurrent of the photodiode 14 activates the input S' of the latch 13. The non-inverting output Q of the latch 13 therefore switches to the status high. As a result, the whole circuit illustrated in FIG. 1 acts as a D-flip-flop.

In this context, the data to be stored in the flip-flop are supplied to the data input D as a data signal. The data are transmitted to the non-inverting output Q and optionally to the inverting output Q' of the latch 13 as soon as a light pulse is received. In this context, the light pulse fulfils the purpose of a rising clock edge in a conventional electronic D-flip-flop. In order to guarantee a reliable operation, the data input D should be constant for a short time (setup time) before the light pulse is received and after the light pulse is finished.

Figure 2:
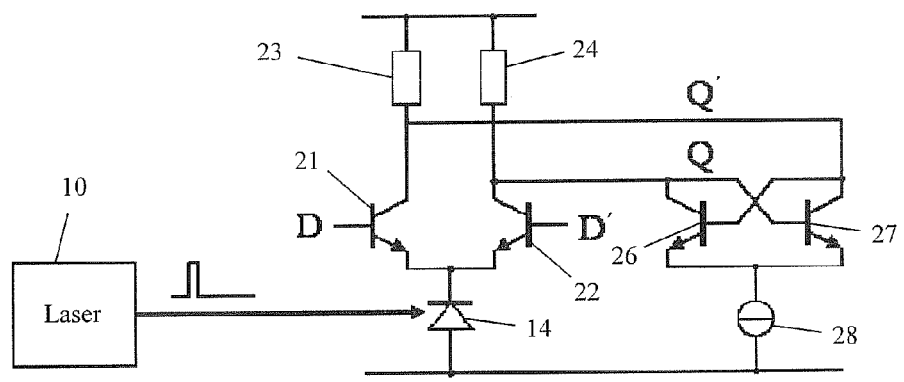
FIG. 2 shows a second exemplary embodiment of the circuit according to the invention.

A practical implementation of the first exemplary embodiment of the circuit according to the invention shown in FIG. 1 is illustrated in FIG. 2. For the implementation of the switch 12 and the latch 13 from FIG. 1, bipolar transistors 21, 22, 26 and 27 are used here. The emitters of the transistors 21, 22 in this context are connected to the photodiode 14, which, for its part, is connected to a negative supply voltage, which can also be connected to earth. Data inputs D and D' are connected to the base terminals of the transistors 21, 22. The data signal is connected to these. The collectors of the transistors 21, 22 are each connected by means of a resistor 23, 24 to a positive supply voltage. The combination of the transistors 21, 22 and the resistors 23, 24 in this context forms the switch 12 from FIG. 1.

The photodiode 14 in this circuit is connected in such a manner that only minimal leakage current flows, so long as no light falls on the photodiode 14. As soon as light falls onto the photodiode 14, a photocurrent passes from an n-doped to a p-doped region of the photodiode. The intensity of the photocurrent is, in a good approximation, proportional to the luminous power of the laser pulse. The switch 12 from FIG. 1 is accordingly formed here by a differential pair of transistors 21, 22, which are charged with the data signal.

The latch 13 from FIG. 1 is also formed by a differential pair of transistors 26, 27. The base terminals of this differential pair are connected crosswise to the collector terminals of the transistors 21, 22. That is to say, the base terminal of the transistor 26 is connected to the collector terminal of the transistor 21. The base terminal of the transistor 27 is connected to the collector terminal of the transistor 22. Moreover, the collector terminal of the transistor 26 is connected to the collector terminal of the transistor 22. The collector terminal of transistor 27 is also connected to the collector terminal of transistor 21. The emitter terminals of the transistors 26, 27 are connected via a current source 28 to a negative supply voltage, which can also be connected to earth. As a result of the crosswise wiring, a positive feedback is generated, and accordingly, the logical status of the latch is maintained. In this context, the zero-signal current of the latch generated by a current source 28 must be significantly smaller than the photocurrent which is generated by the photodiode 14. Only if this condition is fulfilled, can the photocurrent of the photodiode 14 exceed the zero-signal current of the current source 28 and accordingly vary the logical status of the latch.

Figure 3:
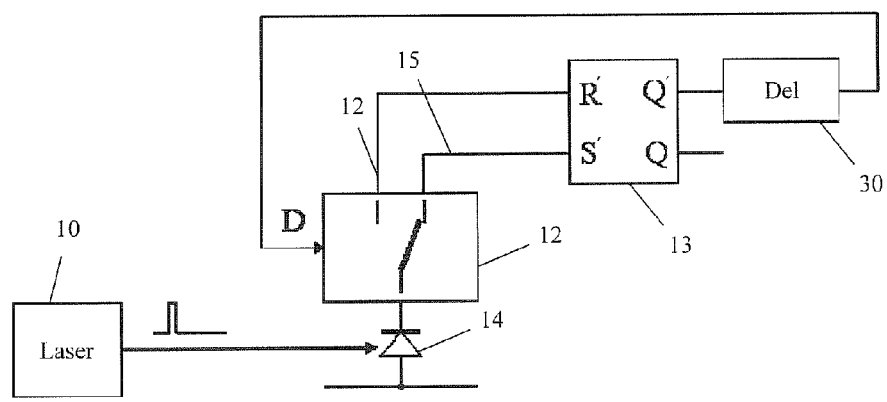
FIG. 3 shows a third exemplary embodiment of the circuit according to the invention.

The optically controlled D-flip-flop illustrated here can be used for a plurality of applications. In particular, it is suitable for use in a high-precision clock generator. Such a high-precision clock generator is shown in FIG. 3. In order to generate a clock signal, of which the clock statuses provide the same length, the inverting output Q' of the latch 13 is fed back via a delaying device 30 to the data input D of the switch 12. To guarantee steady operating, the delaying device 30 delays the inverted signal Q' for at least the duration of one laser pulse. Since the length of one laser pulse is very short, for example, 1 ps or a few ps, a small delay by the delaying device 30 is sufficient. This provides a clock signal, of which the clock statuses occupy 50% of the clock pulse in each case. The frequency of the clock signal corresponds here to half the pulse frequency of the laser 10. Without the delaying device 30, an unsteady status could occur.

Figure 4:
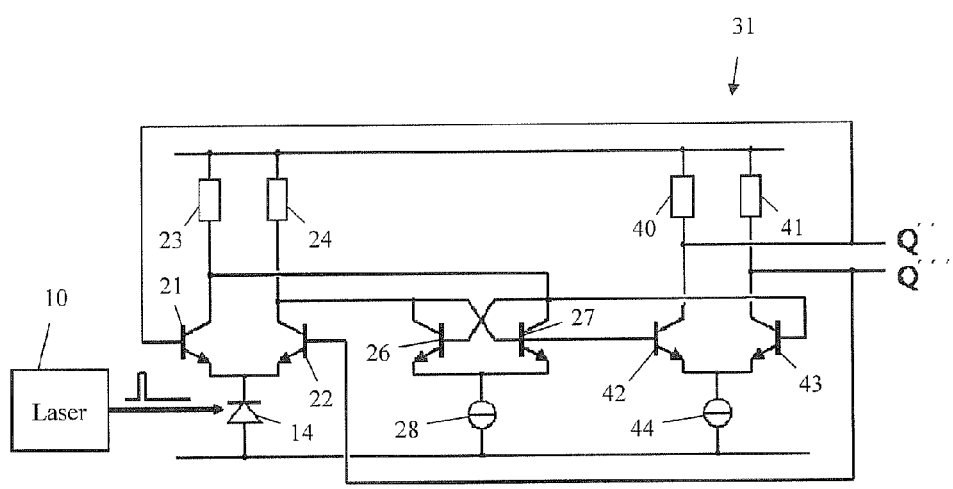
FIG. 4 shows a fourth exemplary embodiment of the circuit according to the invention.

FIG. 4 shows a practical embodiment by means of bipolar transistors of the circuit illustrated in FIG. 3. In this context, the circuit corresponds largely to the circuit shown in FIG. 2. Additionally, a delaying device 31 has been provided. The delaying device 31 comprises two transistors 42, 43, a current source 44 and two resistors 40, 41. The two resistors 40, 41 are each connected between a positive supply voltage and the collector of one of the transistors 42, 43 as load resistors. The emitters of the transistors 42, 43 are each connected to the current source 44, which is connected to a negative supply voltage, which can also be connected to earth. The base of the transistor 42 is connected to the base of the transistor 27. The base of the transistor 43 is connected to the base of the transistor 26. Moreover, the collector of the transistor 42 is connected to the base of the transistor 21 as a feedback. Similarly, the collector of the transistor 43 is connected to the base of the transistor 42.

The invention is not restricted to the exemplary embodiment presented. All of the features described above or illustrated in the drawings can be advantageously combined with one another as required within the scope of the invention. Other transistors, such as PNP bipolar transistors, NMOS or PMOS transistors or even other FET transistors can be used instead of NPN transistors.

The invention claimed is:

1. An electronic circuit comprising:
   a flip-flop, a switching device, a photodiode, and a mode-locked laser,
   wherein the mode-locked laser generates light pulses,
   wherein the light pulses generate a photocurrent in the photodiode,
   wherein the switching device transmits the photocurrent to one of two inputs of the flip-flop,
   wherein the flip-flop outputs its status to at least one output,
   wherein the switching device transfers the photocurrent dependent upon a switch position to one of the two inputs of the flip-flop, and
   wherein the switch position of the switching device depends upon a signal at a data input of the switch.

2. The electronic circuit according to claim 1,
wherein the switching device includes a differential pair of first transistors and two load resistors,
wherein the two load resistors are connected between a supply voltage terminal and collectors of the first transistors, and
wherein emitters of the first transistors are connected to the photodiode.

3. The electronic circuit according to claim 1,
wherein the electronic circuit further includes a delaying device,
wherein the delaying device is connected to an output of the flip-flop,
wherein the delaying device is further connected to a data input of the switching device, and
wherein the delaying device transmits an output signal of the switching device in a delayed manner to the data input.

4. An electronic circuit comprising:
a flip-flop, a switching device, a photodiode, and a mode-locked laser,
wherein the mode-locked laser generates light pulses,
wherein the light pulses generate a photocurrent in the photodiode,
wherein the switching device transmits the photocurrent to one of two inputs of the flip-flop,
wherein the flip-flop outputs its status to at least one output,
wherein the switching device includes a differential pair of first transistors and two load resistors,
wherein the load resistors are connected between a supply voltage terminal and collectors of the first transistors, and
wherein emitters of the first transistors are connected to the photodiode.

5. The electronic circuit according to claim 4,
wherein base terminals of the first transistors correspond to data input of the switching device.

6. The electronic circuit according to claim 5,
wherein the flip-flop includes a differential pair of second transistors and a first current source,
wherein the first current source is connected between emitters of the second transistors and a base terminal,
wherein base terminals of the second transistors are connected crosswise to collectors of the second transistors, and
wherein the collectors of the second transistors are each connected to a collector of the first transistors.

7. The electronic circuit according to claim 5,
wherein the electronic circuit further includes a delaying device,
wherein the delaying device is connected to an output of the flip-flop,
wherein the delaying device is further connected to a data input of the switching device, and
wherein the delaying device transmits an output signal of the switching device in a delayed manner to the data input.

8. The electronic circuit according to claim 4,
wherein the flip-flop includes a differential pair of second transistors and a first current source,
wherein the first current source is connected between emitters of the second transistors and a base terminal,
wherein base terminals of the second transistors are connected crosswise to collectors of the second transistors, and
wherein the collectors of the second transistors are each connected to a collector of the first transistors.

9. The electronic circuit according to claim 8,
wherein a photocurrent of the photodiode is greater during irradiation with a pulse of the mode-locked laser than a current of the first current source.

10. The electronic circuit according to claim 9,
wherein the electronic circuit further includes a delaying device,
wherein the delaying device is connected to an output of the flip-flop,
wherein the delaying device is further connected to a data input of the switching device, and
wherein the delaying device transmits an output signal of the switching device in a delayed manner to the data input.

11. The electronic circuit according to claim 8,
wherein the electronic circuit further includes a delaying device,
wherein the delaying device is connected to an output of the flip-flop,
wherein the delaying device is further connected to a data input of the switching device, and
wherein the delaying device transmits an output signal of the switching device in a delayed manner to the data input.

12. The electronic circuit according to claim 4,
wherein the electronic circuit further includes a delaying device,
wherein the delaying device is connected to an output of the flip-flop,
wherein the delaying device is further connected to a data input of the switching device, and
wherein the delaying device transmits an output signal of the switching device in a delayed manner to the data input.

13. An electronic circuit comprising:
a flip-flop, a switching device, a photodiode, and a mode-locked laser,
wherein the mode-locked laser generates light pulses,
wherein the light pulses generate a photocurrent in the photodiode,
wherein the switching device transmits the photocurrent to one of two inputs of the flip-flop,
wherein the flip-flop outputs its status to at least one output,
wherein the electronic circuit further includes a delaying device,
wherein the delaying device is connected to an output of the flip-flop,
wherein the delaying device is further connected to a data input of the switching device, and
wherein the delaying device transmits an output signal of the switching device in a delayed manner to the data input.

14. The electronic circuit according to claim 13,
wherein the delay of the delaying device is longer than a pulse duration of a pulse of the mode-locked laser.

15. The electronic circuit according to claim 14,
wherein the delaying device includes a differential pair of third transistors, two load resistors and a second current source,
wherein the load resistors are connected between a supply voltage terminal and collectors of the third transistors,
wherein emitters of the third transistors are connected to the second current source, and
wherein base terminals of the third transistors are connected to at least one output of the flip-flop.

16. The electronic circuit according to claim 13,
wherein the delaying device includes a differential pair of third transistors, two load resistors and a second current source,
wherein the load resistors are connected between a supply voltage terminal and collectors of the third transistors,
wherein emitters of the third transistors are connected to the second current source, and
wherein base terminals of the third transistors are connected to at least one output of the flip-flop.

17. The electronic circuit according to claim 16,
wherein the collectors of the third transistors are connected to outputs of the switching device.

\* \* \* \* \*